US012670945B2

(12) United States Patent (10) Patent No.: US 12,670,945 B2
He et al. (45) Date of Patent: Jun. 30, 2026

(54) APPARATUSES AND METHODS FOR TRACKING WORD LINE ACCESSES

(71) Applicant: Micron Technology, Inc., Boise, ID (US)

(72) Inventors: Yuan He, Boise, ID (US); Yang Lu, Boise, ID (US); Dong Pan, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 123 days.

(21) Appl. No.: 18/629,445

(22) Filed: Apr. 8, 2024

(65) Prior Publication Data

US 2024/0347100 A1 Oct. 17, 2024

Related U.S. Application Data

(60) Provisional application No. 63/496,317, filed on Apr. 14, 2023.

(51) Int. Cl.
*G11C 11/406* (2006.01)
*G11C 11/4076* (2006.01)
*G11C 11/408* (2006.01)

(52) U.S. Cl.
CPC .... *G11C 11/4076* (2013.01); *G11C 11/40622* (2013.01); *G11C 11/4085* (2013.01); *G11C 11/406* (2013.01)

(58) Field of Classification Search
CPC .............. G11C 11/4076; G11C 11/406; G11C 11/40622; G11C 11/4085
USPC ........................................ 365/233.1
See application file for complete search history.

(56) References Cited

U.S. PATENT DOCUMENTS

2020/0251158 A1* 8/2020 Shore .................... G11C 11/408
2022/0165347 A1* 5/2022 Pan .................... G11C 11/40611
2023/0186971 A1* 6/2023 Takahashi ......... G11C 11/40618
365/230.03

* cited by examiner

*Primary Examiner* — Ly D Pham
(74) *Attorney, Agent, or Firm* — Dorsey & Whitney LLP

(57) ABSTRACT

A value associated with a number of accesses of a word line and a length of said accesses may be stored on said word line. A timer may provide a periodic signal that increments a counter to update the value. The updated value may then be written back to the word line. In some examples, a memory device including the word lines may have a specification that prevents the word line from closing prior to writing the updated value to the word line.

18 Claims, 7 Drawing Sheets

APPARATUSES AND METHODS FOR TRACKING WORD LINE ACCESSES

CROSS REFERENCE TO RELATED APPLICATION(S)

This application claims the benefit under 35 U.S.C. § 119 of the earlier filing date of U.S. Provisional Application Ser. No. 63/496,317 filed Apr. 14, 2023, the entire contents of which are hereby incorporated by reference in their entirety for any purpose.

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. An auto refresh operation may be carried out where a sequence of memory cells are periodically refreshed. Repeated access to a particular memory cell or group of memory cells (often referred to as a 'row hammer' attack) may cause an increased rate of data degradation in nearby memory cells. Similarly, an extended activation of a row may cause an increased rate of data degradation in nearby memory cells (often referred to as a 'clobber' attack). It may be desirable to identify and refresh memory cells affected by the attack in a targeted refresh operation in addition to the auto refresh operation. Identifying memory cells affected by the row hammer may require additional circuitry and/or increase timing requirements.

DETAILED DESCRIPTION

Figure 1:
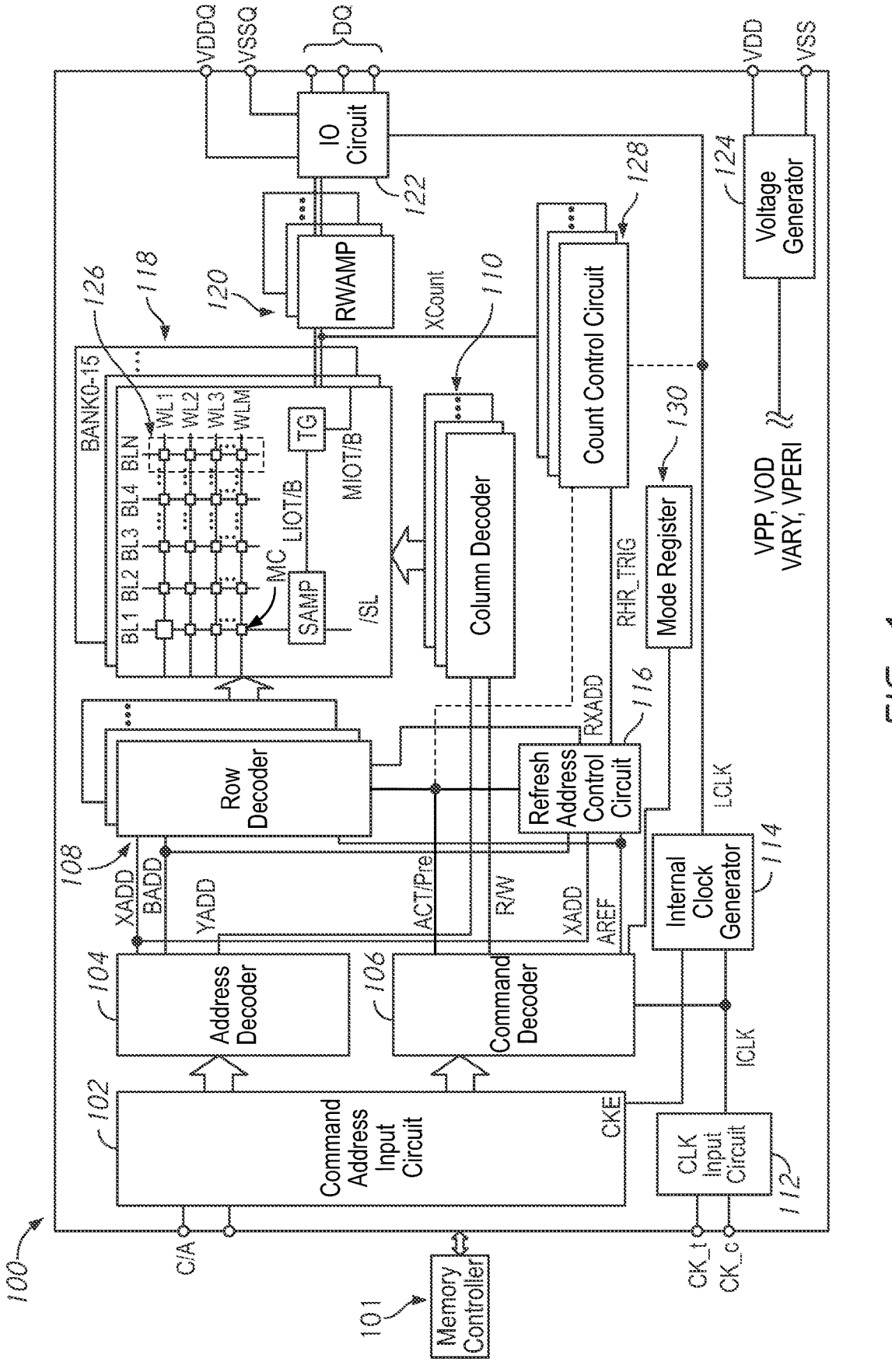
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (word lines) and columns (bit lines) of a memory array, and the memory cells may be refreshed on a row-by-row basis. In order to prevent information from being lost or corrupted due to this decay, the memory device may carry out refresh operations. During a refresh operation, information may be rewritten to the word line to restore its initial state. Auto refresh operations may be performed on the word lines of the memory in a sequence such that over time each of the word lines of the memory are refreshed at a rate faster than the expected rate of data degradation.

Various patterns of access to the memory (generally referred to as attacks) may cause an increased rate of data degradation in one or more memory cells, such that the data would decay before the memory cells can be refreshed as part of the auto-refresh operation. For example, repeated access to a particular row of memory or extended activations (e.g., holding a row at an active voltage level) of a particular row (e.g., an aggressor row) may cause an increased rate of decay in rows (e.g., victim rows) which are close to the aggressor row. These repeated accesses and extended activation periods may be part of a deliberate attack against the memory, accidental accesses due to error (e.g., incorrect programming of a controller), and/or may be due to 'natural' access patterns of the memory. The increased rate of decay in the victim rows may require that they be refreshed as part of a targeted refresh operation. The memory device may periodically perform targeted refresh operations. The targeted refresh operations may be in addition to the auto refresh operations. For example, the memory device may perform a set of refresh operations including a number of auto refresh operations, and a number of targeted refresh operations and then repeat this cycle. In some memories, the targeted refresh operations may 'steal' timeslots which would otherwise be used for auto refresh operations. A memory device may generally cycle between performing access operations for a period of time, performing refresh operations for a period of time, performing access operations and so forth.

Memory devices may include circuitry for detecting aggressor rows and determining the corresponding victim rows to be refreshed during targeted refresh operations. Detecting aggressor rows may include tracking access of rows, for example, during read or write operations. When the access of a row meets one or more criteria, the row may be determined to be an aggressor row. For example, when a number of accesses of a row reaches a threshold within a certain period of time, the memory device may determine the row is an aggressor row. Victim rows of the aggressor row may then be determined and refreshed during targeted refresh operations.

While sampling techniques have been used to detect aggressor rows, more recently, deterministic techniques have been used to track the numbers of accesses for all rows. Examples of deterministic techniques are described in U.S. Pat. Nos. 10,770,127 and 11,462,291 and U.S. patent application Ser. No. 17/565,187, which are incorporated herein by reference for any purpose. Deterministic tracking of row accesses may prevent exploitation of sampling techniques to "hide" row accesses. However, some deterministic techniques that track numbers of accesses may miss aggressor rows where a word line is activated (e.g., "held open") for an extended period of time rather than repeatedly accessed. Holding an aggressor row open may be referred to as a clobber attack. While some techniques account for clobber attacks, such as the '291 patent, simpler techniques and/or improved protection against closure of the row prior to writing back the access count may be desired.

According to embodiments of the present disclosure, an oscillator may be activated responsive to a row activation. The oscillator may be part of a counter that counts a number of periods of time that the row is activated (e.g., an access count). The access count for a particular access may be added to an existing access count value stored in count value memory cells of the row and the sum may be written back to the count value memory cells. In some embodiments, the updated count value is written back each time the counter is incremented. In other embodiments, the updated count value is written back after an external precharge command is received. Updating the access count based, at least in part, on access time may allow a count value that represents a length of time a row remains active rather than only representing a number of times the row is accessed. In some applications, this may allow the memory to account for both row hammer and clobber attacks.

According to embodiments of the present disclosure, a specification of the memory may increase the row precharge time (tRP) to include the write recovery time (tWR). This change to the specification may help ensure a row is held open long enough to write the updated access count value back to the row before it is closed. In some applications, this may help ensure the access count value is written back to the row and/or prevent corruption of the access count value.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including multiple memory banks. In the embodiment of FIG. 1, the memory array 118 is shown as including sixteen memory banks BANK0-BANK15. More or fewer banks may be included in the memory array 118 of other embodiments. Each memory bank includes a plurality of word lines WL, a plurality of bit lines BL and/BL, and a plurality of memory cells MC arranged at intersections of the plurality of word lines WL and the plurality of bit lines BL and/BL. In some embodiments, one or more of the memory cells MC of each word line may be count value memory cells 126. In some embodiments, the count value memory cells 126 may be positioned at the intersection of count bit lines and the word lines. There may be multiple count value memory cells 126 along a given word line and values stored in the count value memory cells 126 may represent a respective access count XCount of the word line and/or data related to the access count XCount. The access count XCount may be a value indicating how many times a word line is accessed, how long the word line is activated during an access operation, or a combination thereof. A data bus associated with the count value memory cells 126 may be coupled to a count control circuit 128. The data bus associated with the count value memory cells 126 may be separate from the data bus which couples the other memory cells to the IO circuit 122.

The selection of the word line WL is performed by a row decoder circuit 108 and the selection of the bit lines BL and/BL is performed by a column decoder circuit 110. In the embodiment of FIG. 1, the row decoder circuit 108 includes a respective row decoder circuit for each memory bank and the column decoder circuit 110 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or/BL. Information may be generally be read from and written to the count value memory cells 126 in an analogous fashion, except that the data in the count value memory cells 126 are read and written by the count control circuit 128.

The semiconductor device 100 may employ a plurality of external terminals that include command and address (C/A) terminals coupled to a command and address bus to receive commands and addresses, and a CS signal, clock terminals to receive clocks CK_t and CK_c, data terminals DQ to provide data, and power supply terminals to receive power supply potentials VDD, VSS, VDDQ, and VSSQ.

The clock terminals are supplied with external clocks CK_t and CK_c that are provided to an input circuit 112. The external clocks may be complementary. The input circuit 112 generates an internal clock ICLK based on the CK_t and CK_c clocks. The ICLK clock is provided to the command decoder circuit 110 and to an internal clock generator 114. The internal clock generator 114 provides various internal clocks LCLK based on the ICLK clock. The LCLK clocks may be used for timing operation of various internal circuits. The LCLK clocks are provided to the input/output circuit 122 to generate data clocks to time operation of circuits included in the input/output circuit 122, for example, to data receivers to time the receipt of write data. Optionally, in some embodiments, an LCLK clock may be provided to the count control circuit 228 to facilitate measuring how long a word line is held open.

The C/A terminals may be supplied with memory addresses. The memory addresses supplied to the C/A terminals are transferred, via a command/address input circuit 202, to an address decoder 104. The address decoder 104 receives the address and supplies a decoded row address XADD to the row decoder circuit 108 and supplies a decoded column address YADD to the column decoder circuit 110. The address decoder 104 may also supply a decoded bank address BADD, which may indicate the bank of the memory array 118 containing the decoded row address XADD and column address YADD. The C/A terminals may be supplied with commands. Examples of commands include access commands for accessing the memory, such as commands for performing read operations and commands for performing write operations. The access commands may be associated with one or more of a row address XADD, column address YADD, and/or bank address BADD to indicate the memory cell(s) to be accessed. In some embodiments, the commands and/or addresses may be provided by a component external to the device 100, for example, as shown in FIG. 1, a memory controller 101 in communication with the device 100.

The commands may be provided as internal command signals to a command decoder circuit 106 via the command/ address input circuit 102. The command decoder circuit 106 includes circuits to decode the internal command signals to generate various internal signals and commands for performing operations. For example, the command decoder circuit 106 may provide a row command signal (e.g., ACT) to select a word line and a column command signal (e.g., R/W) to select a bit line.

The device 100 may receive access commands for performing read operations. When the commands are received, and a bank address, a row address and a column address are timely supplied with the commands, read data is read from memory cells MC in the memory array 118 corresponding to the row address and column address. The commands are received by the command decoder circuit 106, which provides internal commands so that read data from the memory array 118 is provided to the read/write amplifiers 120. The read data is output to outside from the data terminals DQ via the input/output circuit 122. The access count XCount stored in the count value memory cells 126 of the word line associated with the row address XADD are read to the count control circuit 128. The count control circuit 128 may update the access count XCount and provide the updated access count to the memory array 118 to write back to the count value memory cells 126 of the word line associated with the row address XADD.

The device 100 may receive access commands for performing write operations. When the commands are received, and a bank address, a row address and a column address are timely supplied with the commands, write data supplied to the data terminals DQ is written to a memory cells in the memory array 118 corresponding to the row address and column address. The commands are received by the command decoder circuit 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC. The access count XCount stored in the count value memory cells 126 of the word line associated with the row address XADD are read to the count control circuit 128. The count control circuit 128 may update the access count XCount and provide the updated access count to the memory array 118 to write back to the count value memory cells 126 of the word line associated with the row address XADD.

After various access commands have been received, such as those described above, a precharge command may be received. In some embodiments, the precharge command may be indicated by an active precharge signal Pre. In some embodiments, a deactivation of the activation ACT signal may indicate the active precharge signal Pre. A word line may be deactivated (e.g., "closed") responsive to the Pre signal. In some cases, if an operation is being performed on the word line (e.g., writing data to the word line) when the active precharge signal Pre is received, the operation may not be completed.

The command decoder 106 may access mode register 130 that is programmed with information for setting various modes and features of operation for the semiconductor device 100. For example, the mode register 130 may provide parameters that allow the semiconductor device 100 to operate at different frequencies, provide different burst lengths, allow banks BANK0-15 to be organized into different groups, operate in ×4, ×8, or ×16 mode, and/or other different operating conditions (e.g., post-package repair mode). In some embodiments, mode register 130 may include multiple registers.

The information in the mode register 130 may be programmed by providing the semiconductor device 100 a mode register write command (e.g., from controller 101), which causes the semiconductor device 100 to perform a mode register write operation. In some embodiments, data to be written to the mode register 130 is provided via the C/A terminals and/or the DQ terminals. The command decoder 106 accesses the mode register 130, and based on the programmed information along with the internal command signals, provides the internal signals to control the circuits of the semiconductor device 100 accordingly. Information programmed in the mode register 130 may be externally provided by the semiconductor device 100 using a mode register read command, which causes the semiconductor device 100 to access the mode register 130 and provide the programmed information (e.g., to the memory controller 101). In some embodiments, the information may be provided via the C/A terminals and/or the DQ terminals.

Returning to the count control circuit 128, when an access count XCount is provided for a word line, the count control circuit 128 may compare the access count XCount to a threshold value. If the access count XCount is below the threshold value, the count control circuit 128 may change (e.g., increment, decrement) the access count XCount for the word line and provide the updated access count to the memory array 118 as described previously. If the access count XCount is equal to or greater than the threshold value, the count control circuit 128 may activate an aggressor row detection signal RHR_TRIG, which may be provided to a refresh control circuit 116. Although the count control circuit 128 is shown as a separate component in FIG. 1, in some embodiments, the count control circuit 128 may be included as a component of the refresh control circuit 116.

In some embodiments, the count control circuit 128 may change the access count XCount after activating the RHR-_TRIG signal (e.g., reset to an initial value, reset to zero). In some embodiments, the threshold value may be preprogrammed by a manufacturer of the device 100. In other embodiments, the threshold value may be programmed by the controller 101. For example, by writing a value to the mode register 130 via a mode register write command. Further, although examples described herein refer to one threshold value, the access count XCount may be compared to multiple threshold values. For example, for refreshing victim rows adjacent to an aggressor row (e.g., +/−1), the threshold value may be one value, and for refreshing victim rows further away from the aggressor row (e.g., +/−2), the threshold value may be another value.

In some embodiments, the count control circuit 128 may include a timer (not shown in FIG. 1). The timer may track how long the word line corresponding to the access count XCount is activated. The timer may track a number of time periods (e.g., a number oscillations of an oscillator, clock cycles of a clock signal, a number of nanoseconds, a number of microseconds) the word line is activated. In some embodiments, the timer may be activated responsive to receipt of an external activation command and deactivated responsive to an external precharge command. In some embodiments, the external precharge command may be received prior to the issuance of an internal precharge command from the command decoder 106. For each time period that elapses, the count control circuit 128 may update a count value stored in the count control circuit 128. In some embodiments, the count control circuit may update the access count XCount stored in the count control circuit 128. In some embodiments, the count control circuit 128 may compare the updated access count XCount to the threshold value each time the access count XCount is updated as discussed previously. Various techniques may be used to detect how long the word line is activated. For example, the count control circuit 128 may track how long the activation signal ACT is active. In another example, the count control circuit 128 may track how long the word line is held at an active voltage. Other techniques may be used in other embodiments.

In some embodiments, the count control circuit 128 may write the updated access count XCount to the memory array 118 each time the access count XCount is updated. In some embodiments, the count control circuit 128 may write the updated access count XCount to the memory array 118 after the external active precharge signal Pre has been received but before the internal precharge Pre signal is provided by the command decoder 106. In some embodiments, the count control circuit 128 may combine the count value (e.g., sum) with the access count XCount value to generate the updated access count XCount.

In some embodiments, the memory specification and/or standard for the timing between when the external precharge signal is received and when the internal precharge signal is issued may be based on the write recovery time (tWR) of the device 100. In some embodiments, tWR may be equal to or approximate to 15 nanoseconds. This may prevent premature closing of the row before the updated access count XCount is written back to the counter memory cells 126 of the memory array 118. Thus, in some embodiments the row precharge time (tRP) may be longer for devices 100 of the present disclosure than existing devices. The standard may be set by an organization in some embodiments, such as Joint Electron Device Engineering Council (JEDEC) Solid State Technology Association.

The device 100 may also receive commands from controller 101 causing it to carry out one or more refresh operations as part of a self-refresh mode. The device 100 may be periodically placed in a refresh mode. Thus, refresh operations may be performed periodically each time the memory device is in the refresh mode. In some embodiments, the refresh mode command may be externally issued to the memory device 100. In some embodiments, the refresh mode command may be periodically generated by a component of the device. In some embodiments, when an external signal indicates a refresh mode entry command (e.g., an external refresh command), the refresh signal AREF may also be activated. The refresh signal AREF may be a pulse signal which is activated when the command decoder circuit 106 receives a signal which indicates entry to the self-refresh mode. The refresh signal AREF may be activated once immediately after command input, and thereafter may be cyclically activated at desired internal timing. In some embodiments, the refresh signal AREF may cause more than one refresh operation to be performed, which may be referred to as a "multi pump" refresh. In some embodiments, the refresh signal AREF may be active during the refresh mode. In some embodiments, the refresh signal AREF may be active during the multiple refresh operations. The refresh signal AREF may be used to control the timing of refresh operations during the refresh mode. A self-refresh exit command may cause the automatic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder circuit 108, which may refresh one or more word lines WL indicated by the refresh row address RXADD. In some embodiments, the refresh address RXADD may represent a single word line. In some embodiments, the refresh address RXADD may represent multiple word lines, which may be refreshed sequentially or simultaneously by the row decoder circuit 108. In some embodiments, the number of word lines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of word lines represented by the address), or may operate based on internal logic.

The refresh control circuit 116 may selectively output a targeted refresh address (e.g., which specifies one or more victim address based on an aggressor) or an automatic refresh address (e.g., from a sequence of auto refresh addresses) as the refresh address RXADD. Based on the type of refresh address RXADD, the row decoder circuit 108 may perform a targeted refresh or auto refresh operation. The automatic refresh addresses may be from a sequence of addresses which are provided based on activations of the refresh signal AREF and/or pumps generated responsive to AREF. The refresh control circuit 116 may cycle through the sequence of auto refresh addresses at a rate determined by AREF. In some embodiments, the auto refresh operations may generally occur with a timing such that the sequence of auto refresh addresses is cycled such that no information is expected to degrade in the time between auto refresh operations for a given word line. In other words, auto refresh operations may be performed such that each word line is refreshed at a rate faster than the expected rate of information decay.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. For example, in some embodiments, the refresh control circuit 116 may latch a current row address XADD as an aggressor row address responsive to an active RHR_TRIG signal provided by the count control circuit 128. The refresh address RXADD may be calculated based on the latched row addresses XADD provided by the address decoder 104. The refresh address RXADD may be provided with a timing based on a timing of the refresh signal AREF.

While in general the present disclosure refers to determining aggressor and victim word lines and addresses, it should be understood that as used herein, an aggressor word line does not necessarily need to cause data degradation in neighboring word lines, and a victim word line does not necessarily need to be subject to such degradation. The device 100 may use some criteria to judge whether an address is an aggressor address, which may capture potential aggressor addresses rather than definitively determining which addresses are causing data degradation in nearby victims. Similarly, victim addresses may be determined based on which word lines are expected to be effected by aggressors, rather than a definitive determination of which word lines are undergoing an increased rate of data decay.

The refresh address RXADD may be provided with a timing based on a timing of the refresh signal AREF. During the periodic refresh operations of a refresh mode, the refresh control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto refresh address. In some embodiments, certain time slots may be reserved for targeted refresh addresses, and the refresh control circuit 116 may determine whether to provide a targeted refresh address, not provide an address during that time slot, or provide an auto refresh address instead during the time slot.

The refresh control circuit 116 may use multiple methods to determine the timing of targeted refresh operations. The refresh control circuit 116 may have periodic targeted refresh operations during a refresh mode, where the refresh control circuit 116 performs auto refresh operations and targeted refresh operations (e.g., by providing a targeted refresh address as the refresh address RXADD) based on a periodic schedule. For example, after entering a refresh mode, the refresh control circuit 116 may perform a certain number of auto refresh operations, and then perform (e.g., steal) a certain number of targeted refresh operations. For multi pump refresh operations, each time the active refresh signal AREF is received, the refresh control circuit 116 may perform M different refresh operations, by providing M different refresh addresses RXADD. The refresh control circuit 116 may have a fixed pattern where some pumps are assigned to auto refresh operation and some pumps are assigned to targeted refresh operations.

In some embodiments, the refresh control circuit 116 may perform targeted refresh operations responsive to an active RHR_TRIG signal provided by the count control circuit 128. Targeted refresh operations performed responsive to the active RHR_TRIG may be in addition to or instead of period targeted refresh operations. In some embodiments, the targeted refresh operations responsive to the active RHR-_TRIG signal may be performed outside of a regularly scheduled refresh mode.

Optionally, the refresh control circuit 116 may activate a busy signal (not shown), which may be provided to an external pin of device 100, such as an alert pin (not shown), DQ pad, or a multi-use terminal. The busy signal may be received by an external device, such as the memory controller 101, via the external pin. The busy signal may notify the external device that the device 100 is performing targeted refresh operations and is not available to perform access operations. Once the targeted refresh operations have been completed, the refresh control circuit 116 may deactivate the busy signal. Optionally, the refresh control circuit 116 or count control circuit 128 may provide the RHR-_TRIG signal to an external terminal of the device 100.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder circuit 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

As used herein, an activation of a signal may refer to any portion of a signal's waveform to which a circuit responds. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level.

Figure 2:
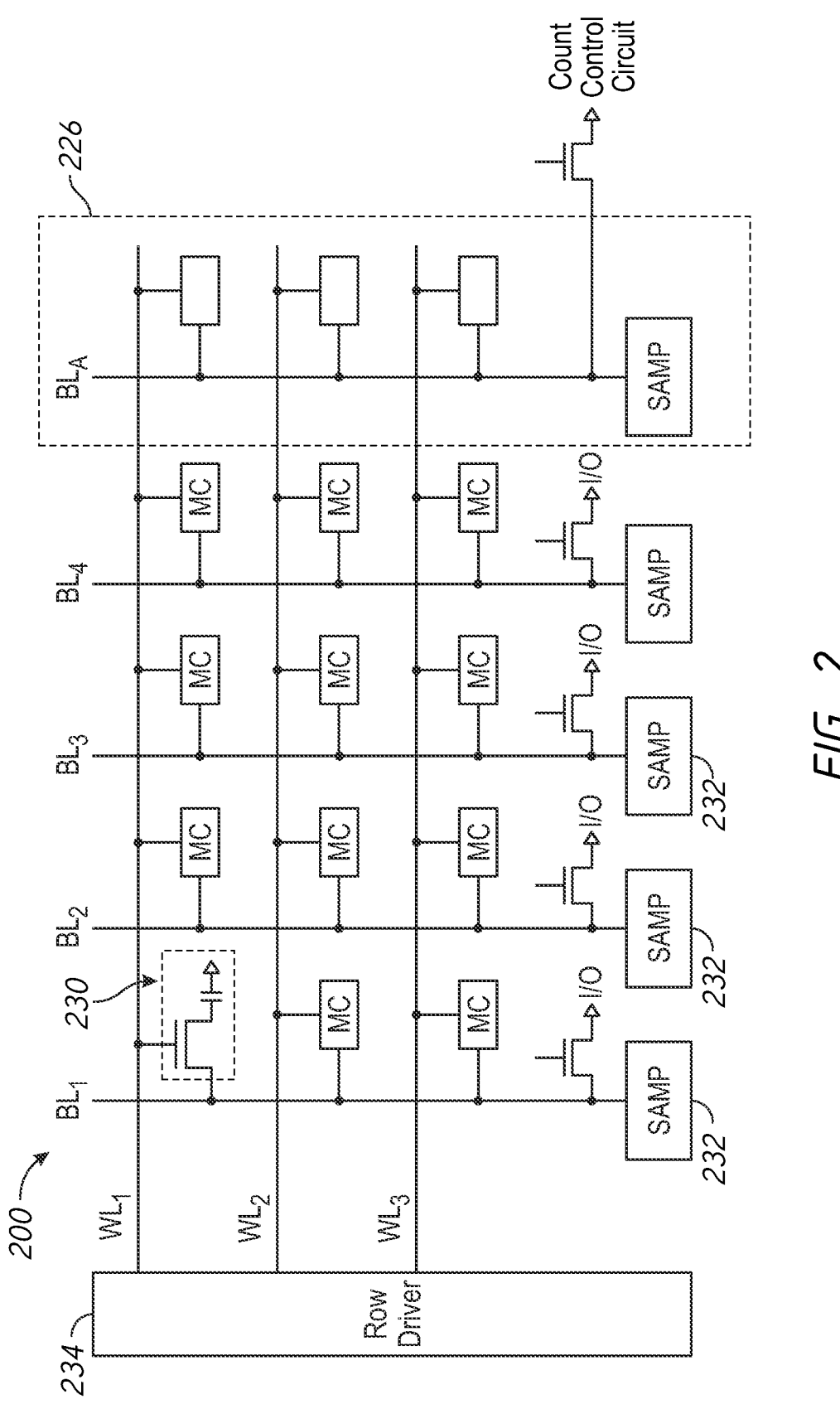
FIG. 2 is a block diagram of a memory cell array according to an embodiment of the present disclosure.

FIG. 2 is a block diagram of a memory cell array according to an embodiment of the present disclosure. The memory cell array 200 may represent an exemplary portion of a memory array, such as the memory array 118 of FIG. 1. The memory cell array 200 includes a plurality of word lines WL (rows) and bit lines BL (columns). A row driver 234 is coupled to the rows. In some embodiments, the row driver 234 may be controlled by and/or included in a row decoder, such as row decoder circuit 108. A plurality of memory cells MC, such as example memory cell 230, are located at the intersection of the rows and columns. Certain of the memory cells along each of the word lines WL may be count value memory cells 226. Each of the bit lines BL may be coupled to a respective sense amplifier 232.

Each of the memory cells MC may store information. In some embodiments, the information may be stored as a binary code, and each memory cell MC may store one or more bits, which may be either at a logical high or a logical low level. Example memory cell 230 shows a particular implementation which may be used to store a bit of information in some embodiments. Other types of memory cells may be used in other examples. In the example memory cell 230, a capacitive element stores the bit of information as a charge. A first charge level may represent a logical high level, while a second charge level may represent a logical low level. One node of the capacitive element is coupled to a reference voltage (e.g., VSS). The other node of the capacitive element is coupled to a switch. In the example memory cell 230, the switch is implemented using a transistor. A sense node of the switch (e.g., the gate of the transistor) is coupled to the word line. The word line WL may be accessed by the row driver 234 setting a voltage along the word line such that the switches in the memory cells MC are closed, coupling the capacitive elements (or other bit storage element) to the associated bit lines BL.

The sense amplifiers 232 may read or write a value of a bit of information along the bit line BL to memory cell MC at the accessed word line WL. The sense amplifiers may convert a signal along the bit line to a signal which is 'readable' by other elements of the memory device (e.g., by amplifying a voltage). The bit lines may be coupled to an input/output circuit (e.g., input/output circuit 122 of FIG. 1) via a respective column select switch, which may be a column select transistor.

In an example read operation, when a word line WL is accessed, the memory cells MC may provide their charge onto the coupled bit lines BL which may cause a change in a voltage and/or current along the bit line BL. The sense amplifier 232 may determine a logical level of the accessed memory cell MC based on the resulting voltage and/or current along the bit line BL, and may provide a signal corresponding to the logical level through the column select transistor to the input/output circuit.

In an example write operation, the sense amplifiers 232 may receive a signal indicating a logical level to be written to the accessed memory cells from the input/output circuit. The sense amplifier 232 may provide a voltage and/or current along the coupled bit line BL (e.g., along the bit lines with active column select transistors) at a level corresponding to the logical level to be written. The voltage and/or current along the bit line BL may charge the capacitive element at the intersection of the bit line with an accessed word line to a charge level associated with the written logical level. In this manner, by specifying the row which is accessed, and which bit lines to record data from (and/or write data to), specific memory cells MC may be accessed during one or more operations of the memory device.

During an example refresh operation (either targeted or auto-refresh), the word line WL to be refreshed may be read, and then logical value read from each of the memory cells along that may be written back to the same memory cells. In this manner the level of charge in the refreshed memory cells MC may be restored to the full value associated with the logical level stored in that memory cell.

Certain memory cells along each of the word lines may be count value memory cells 226 (which may be used to implement count value memory cells 126). The count value memory cells 226 may generally be similar to the other memory cells of the memory array 200 or may be a different type of memory cell (e.g., 2TC cells). Whether similar or different than the memory cells 230, rather than being coupled to the input/output circuit of the memory, the count value memory cells 226 may be coupled to a count control circuit (e.g., count control circuit 128 of FIG. 1). The count control circuit may read and/or write a value of an access count for a given word line, which may be stored as a binary number in the count value memory cells 226 of the given word line. In some embodiments, the count control circuit may be in an area local to the count value memory cells 226, and so the communication of the count control circuit and the count value memory cells 226 may be very rapid.

In some embodiments, the count value memory cells 226 may be organized along particular bit lines of the memory array 200. Thus, there may be counter bit lines (and associated counter sense amplifiers 232) which are coupled to the count value memory cells 226. The count value memory cells 226 may be arranged at the intersection of the counter bit lines and the word lines. The counter bit lines may include counter select transistors (similar to the column select transistors), which selectively allow data from the counter bit lines to be read to the count control circuit. In some embodiments, the time duration over which the counter select transistors are active may be different (e.g., the counter select transistors may be active longer) than the time the column select transistor(s) are active in a given access operation. The counter bit lines and counter sense amplifiers may be coupled through a data bus to the count control circuit. In some embodiments, the count value memory cells 226 may be positioned along an end of the memory array 200. This may decrease a length of the counter data bus. For example, if there are some number n of count value memory cells 226 along each word line, the count value memory cells 226 may be the first n memory cells of the word line, or the last n memory cells of the word line.

For clarity of illustration, only a few word lines WL and bit lines BL (and their corresponding memory cells MC) are shown in FIG. 2. More word lines WL and bit lines BL may be provided in a memory array of the present disclosure. Similarly, FIG. 2 only shows a single counter bit line of count value memory cells 226. However, each word line WL may have a number of count value memory cells 226 based on an expected maximum value of an access count that may need to be stored in the count value memory cells 226. In some embodiments, there may be between 8 and 16 count value memory cells 226 along each word line. More or fewer count value memory cells 226 may be used in other examples.

Figure 3:
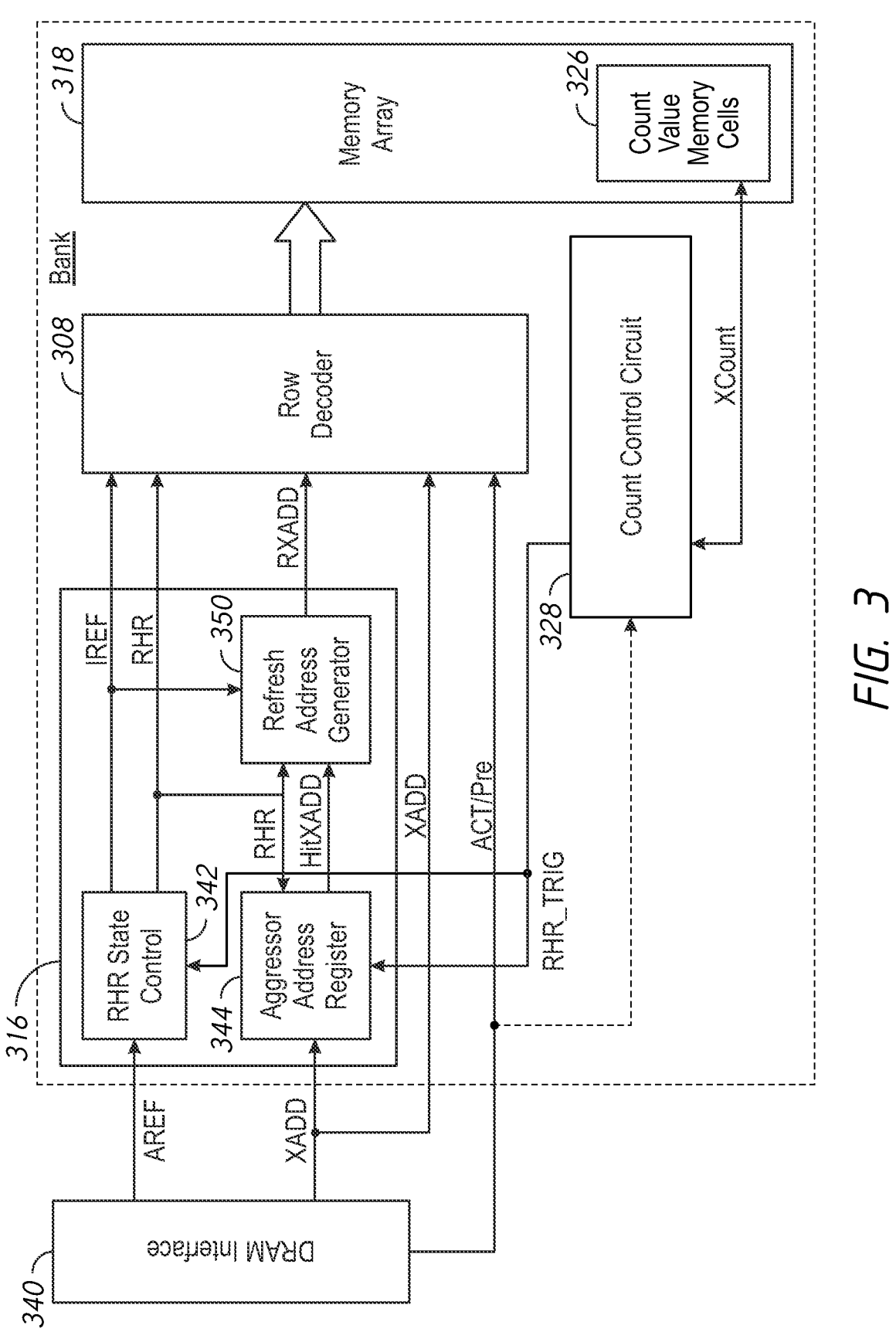
FIG. 3 is a block diagram of a refresh control circuit and a count control circuit according to an embodiment of the present disclosure.

FIG. 3 is a block diagram of a refresh control circuit and a count control circuit according to an embodiment of the present disclosure. For context, a row decoder 308, a DRAM interface 340, and a memory array 318 are also shown. In some embodiments, the refresh control circuit 316 may be used to implement the refresh control circuit 116 of FIG. 1. Similarly, the row decoder 308 may be used to implement the row decoder circuit 108, the memory array 318 may be used to implement memory array 118, and the count control circuit 328 may be used to implement the count control circuit 128 of FIG. 1. Certain internal components and signals of the refresh control circuit 316 are shown to illustrate the operation of the refresh control circuit 316. The dotted line around the refresh control circuit 316, the row decoder 308, count control circuit 328, and the memory array 318 is shown to represent that in certain embodiments, each of the components within the dotted line may correspond to a particular bank of memory (e.g., memory banks BANK0-15 of memory array 118), and that these components may be repeated for each of the banks of memory. In some embodiments, the components shown within the dotted line may be associated with each of the memory banks. Thus, there may be multiple refresh control circuits 316, count control circuits 328, and row decoders 308. For the sake of brevity, components for only a single bank will be described. Further, in some embodiments one or more of the components may be shared between banks.

A DRAM interface 340 may provide one or more signals to the address refresh control circuit 316 and row decoder 308 which in turn (along with a column decoder, not shown) may perform access operations on the memory array 318. The DRAM interface 340 may represent one or more components which provides signals to components of the bank. In some embodiments, the DRAM interface 340 may include a memory controller coupled to the semiconductor memory device (e.g., memory controller 101). In some embodiments, the DRAM interface 340 may represent one or more components of a semiconductor device (e.g., device 100) such as the command address input circuit 102, the address decoder 104, and/or the command decoder circuit 106 of FIG. 1. The DRAM interface 340 may provide a row address XADD, the auto-refresh signal AREF, an activation signal ACT, and a precharge signal Pre. The auto-refresh signal AREF may be a periodic signal which may indicate when an auto-refresh operation is to occur. The activation signal ACT may be provided to activate a given bank of the memory. The precharge signal Pre may be provided to precharge the given bank of the memory. The row address XADD may be a signal which specifies one or more particular word lines of the memory array 318, and may be a signal including multiple bits (which may be transmitted in series or in parallel).

The count control circuit 328 may be coupled to the memory array 318, particularly, to the count value memory cells 326 of the memory array 318. The count value memory cells 326 may be used to implement the count value memory cells 126 and/or 226 in some embodiments. When a word line of the memory array 318 is accessed, the value XCount of the count value memory cells 326 along that word line are read to the count control circuit 328. In embodiments with multiple counters, the value XCount may include multiple values (XCount0-N). The count control circuit 328 may determine a value of the access count for that row based on the value(s) read from the count value memory cells 326. The count control circuit 328 may determine if the value of the access count for the word line exceeds a threshold value (e.g., if the value is greater than the threshold value) or is equal to a threshold value. If the value is not equal to or does not exceed the threshold (e.g., if the value is less than the threshold), then the count control circuit 328 may update (e.g., change) a value of the access count and write the updated count back to the count value memory cells 326. Updating the count may include incrementing or decrementing the count in some embodiments. If the value does equal or exceed the threshold, then the current address XADD may be determined to be an aggressor address. If the current address XADD is an aggressor address, an active aggressor row detection signal RHR_TRIG may be provided to the refresh control circuit 316, which may record (e.g., latch) the current value of the row address XADD. In some embodiments, the active aggressor row detection signal RHR_TRIG may further trigger a targeted refresh operation. In some embodiments, if the value of the count exceeds the threshold, then the count control circuit 328 may reset a value of the count, for example, by writing an initial value of the count (e.g., 0) back to the count value memory cells 326.

In some embodiments, the count control circuit 328 may further update the value of the count responsive to the passage of a period of time over which the word line is activated. For example, the count control circuit 328 may update the count value every time some number of nanoseconds has passed and/or each time a clock/timer signal is oscillated. The updated value of the count may be compared to the threshold value as described above after each update of the count value (e.g., after each period of time the word line remains activated). Various techniques may be used to determine how long a word line is activated. For example, in some embodiments, the count control circuit 328 may receive the ACT/Pre signal from the DRAM interface 340. In some embodiments, the count control circuit 328 may receive external ACT and/or Pre signals provided from a memory controller or signals indicating such external commands have been received. In some embodiments, the external Pre (or signal indicating the external Pre) may be received prior to an internal Pre signal (e.g., one provided by a command decoder of the memory device). The length of time the word line is activated may be based, at least in part, on a length of time the ACT signal is active. For example, the length of time may be measured from when the external or internal ACT signal is received to when the external Pre signal is received.

In some embodiments, the refresh control circuit 316 may include an RHR state control circuit 342, an aggressor address register 344, and a refresh address generator 350.

The RHR state control circuit 342 may receive the AREF signal from the DRAM interface and the RHR_TRIG signal from the count control circuit 328. The RHR state control circuit 342 may provide an active signal RHR to indicate that a targeted refresh operation, such as a row hammer refresh (e.g., a refresh of the victim rows corresponding to an identified aggressor row) should occur. The RHR state control circuit 342 may also provide an active internal refresh signal IREF, to indicate that an auto-refresh operation should occur. The auto-refresh signal AREF may be periodically activated and may be used to control the timing of refresh operations. In some embodiments, the signals RHR and IREF may be activated such that they are not active at the same time (e.g., are not both at a high logic level at the same time).

The memory device may carry out a sequence of auto-refresh operations in order to periodically refresh the rows of the memory device. The RHR signal may be activated in order to indicate that the device should refresh a particular targeted row (e.g., a victim row) instead of an address from the sequence of auto-refresh addresses. The RHR state control circuit 342 may use internal logic to provide the active RHR signal. For example, in some embodiments, the RHR state control circuit 342 may provide the active RHR signal based on certain number of activations of AREF (e.g., every 4th activation of AREF). Additionally or alternatively, the RHR state control circuit 342 may activate the RHR signal responsive to receiving an active RHR_TRIG signal from the count control circuit 328. In some embodiments, the active RHR_TRIG may trigger the refresh control circuit 316 to cause a targeted refresh operation to be performed outside the time period of a regularly scheduled refresh operation.

Responsive to an activation of RHR, the aggressor address register 344 may provide an aggressor address HitXADD, and the refresh address generator 350 may provide a refresh address RXADD, which may be one or more victim addresses associated with HitXADD (e.g., row addresses of victim rows of the identified aggressor row). Responsive to IREF, the refresh address generator 350 may provide an auto-refresh address as the refresh address RXADD. The row decoder 308 may perform a refresh operation responsive to the refresh address RXADD and the targeted refresh signal RHR. The row decoder 308 may perform an auto-refresh operation based on the refresh address RXADD and the internal refresh signal IREF.

The aggressor address register 344 may store one or more row addresses which have been identified as aggressor addresses by the count control circuit 328. Responsive to the command signal RHR_TRIG from the count control circuit 328, the aggressor address register 344 may store the current row address XADD which is being accessed. The aggressor address register 344 may provide the stored address as a match address HitXADD to the refresh address generator 350, which may calculate one or more victim addresses associated with the match address HitXADD. In some embodiments, the aggressor address register 344 may be a latch circuit which stores a single address. In some embodiments, the aggressor address register 344 may be a buffer which stores multiple addresses, and provides the first stored address as the match address HitXADD. The aggressor address register 344 may switch to a next address in the register after the victim row(s) associated with the first address have been refreshed.

The refresh address generator 350 may receive the targeted refresh signal RHR and the match address HitXADD. The match address HitXADD may represent an aggressor row. The refresh address generator 350 may determine the locations of one or more victim rows based on the match address HitXADD and provide them as the refresh address RXADD. In some embodiments, the victim rows may include rows which are physically adjacent to the aggressor row or rows (e.g., HitXADD+1 and HitXADD−1). Other relationships between victim rows and the identified aggressor rows may also or alternatively be used in other examples.

The refresh address generator 350 may determine the value of the refresh address RXADD based on the targeted refresh signal RHR and the internal auto-refresh signal IREF. In some embodiments, when the signal IREF is active, the refresh address generator 350 may provide one of a sequence of auto refresh addresses. When the signal RHR is active, the refresh address generator 350 may provide a targeted refresh address, such as a victim address, as the refresh address RXADD. In some embodiments, multiple targeted refresh addresses may be provided for a refresh operation. For example, for a multi pump refresh operation, a different targeted refresh address may be provided for each pump (e.g., HitXADD+1 and HitXADD−1).

The row decoder 308 may perform one or more operations on the memory array 318 based on the received signals and addresses. For example, responsive to the activation signal ACT and the row address XADD (and IREF and RHR being inactive), the row decoder 308 may direct one or more access operations (for example, a read operation) on the specified row address XADD. Responsive to the RHR signal being active, the row decoder 308 may refresh the refresh address RXADD. In some embodiments, the count control circuit 328 may increment the access count stored in the count value memory cells 326 responsive to a refresh operation of a given row. In some embodiments, the count control circuit 328 may not increment the access count responsive to a refresh operation.

The refresh control circuit 316 is provided merely as an example, and other types of refresh control circuits may be used in other embodiments.

Figure 4:
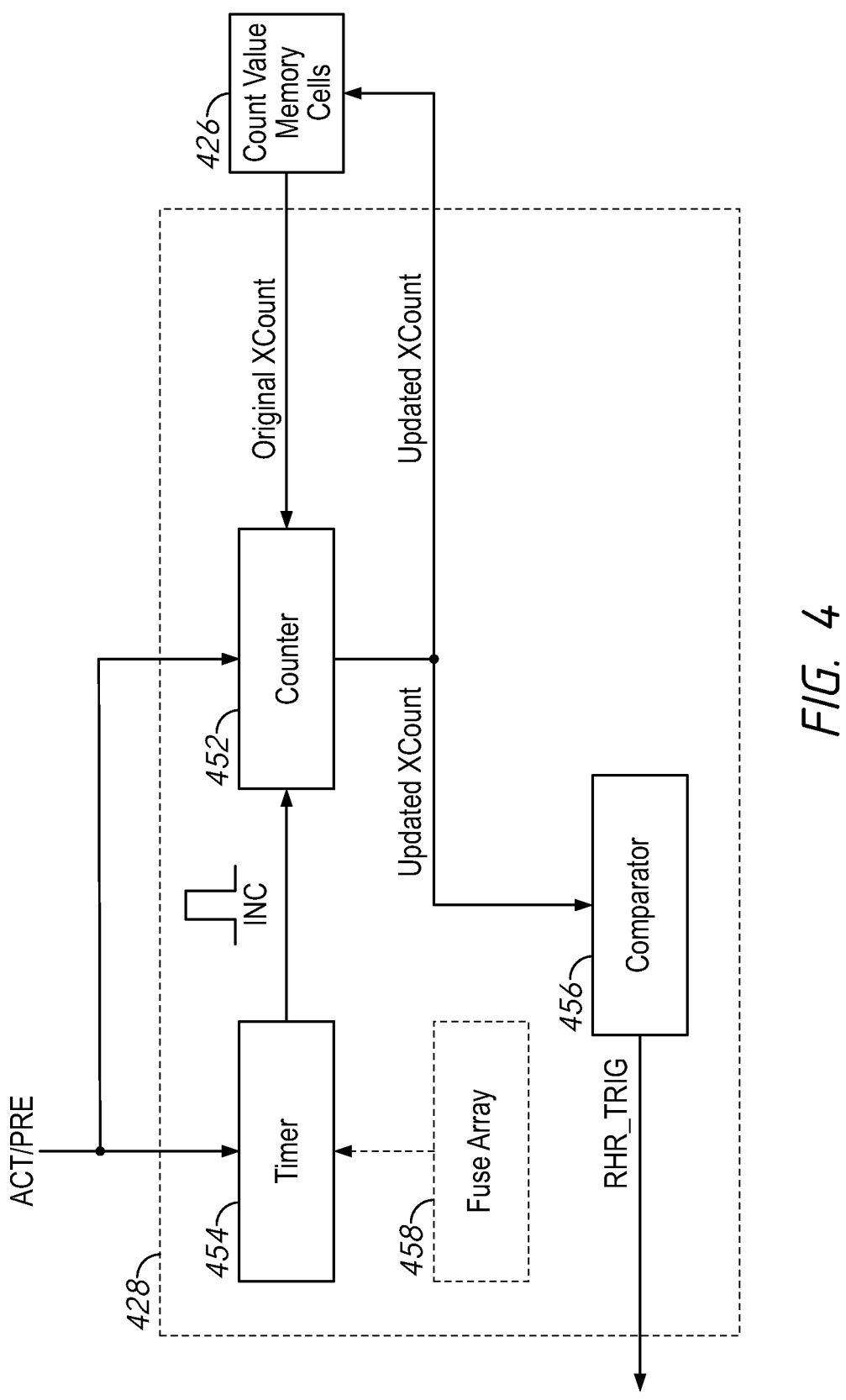
FIG. 4 is a block diagram of a count control circuit according to an embodiment of the present disclosure.

FIG. 4 is a block diagram of a count control circuit according to an embodiment of the present disclosure. In some embodiments, the count control circuit 428 may be used to implement the count control circuit 128 of FIG. 1 and/or the count control circuit 328 of FIG. 3. The count control circuit 428 may include a counter 452, a timer 454, a comparator 456, and optionally, a fuse array 458. The count control circuit 428 may be coupled to count value memory cells of a memory array (e.g., memory array 118). A block diagram of the count value memory cells 426 for a word line is shown in FIG. 4 for context. The count value memory cells 426 may include count value memory cells 326 of memory array 318, count value memory cells 226, and/or count value memory cells 126 in some embodiments.

When a word line is accessed, the count control circuit 428 may read the count value XCount from the count value memory cells 426 of the word line and store it in the counter 452. In some embodiments, the count control circuit 428 may read the count value XCount from the count value memory cells 426 responsive to the ACT command (e.g., an active ACT signal). The counter 452 may store the count value XCount in a register or other circuit. In some embodiments, the counter 452 may include a hammer counter. The counter 452 may receive an increment signal INC from the timer 454. In some embodiments, such as the one shown in FIG. 4, the increment signal INC may be a pulse signal. Responsive to the pulse of INC, the counter 452 may update the count value XCount (e.g., increment the count value).

The timer 454 may provide the increment signal INC when enabled. The timer 454 may be enabled by an ACT command and/or an active ACT signal and may be disabled by a precharge command and/or inactive ACT signal. When enabled, the timer 454 may provide the pulses INC periodically in some embodiments. The period of the increment signal INC may be based, at least in part, on an expected time a word line is active during an access command. For example, the period may be 200 ns or approximately 200 ns. The period may vary depending on the memory type or other factors. The timer 454 may allow the access count XCount to reflect not only a number of accesses of the word line but a length of time the word line was kept open. For example, if a "normal" access time is 200 ns and a word line is accessed and remains open for 600 ns, the access count XCount may be incremented as if the word line were accessed three times. In some applications, this increase in the access count for a single access of the word line may allow the memory device to more accurately respond to degradation of data in surrounding word lines.

In some embodiments, the timer 454 may be programmable or partially programmable (e.g., trimmable). For example, the period of the increment signal INC and/or a delay for initiating the increment signal INC may be programmable. In some embodiments, the period and/or delay may be programmed in a fuse array 458. Although the fuse array 458 is shown as part of the count control circuit 428 in FIG. 4, in some embodiments, the fuse array 458 may be included, at least in part, in another component of the memory device (e.g., a fuse array at least partially associated with a global redundancy control circuit). In some embodiments, the period and/or delay may be programmed based on data stored in a mode register, such as mode register 130.

The counter 452 may provide the access count value XCount to the comparator 456. In some embodiments, the counter 452 may provide the original XCount read from the count value memory cells 426 and an updated XCount each time the XCount value is incremented responsive to the pulse of INC. In some embodiments, the counter 452 may not provide the original XCount and/or may provide the updated XCount after the timer 454 is disabled rather than after each increment. The comparator 456 may compare the XCount value to one or more threshold values. Based on the comparison, the comparator 456 may activate an aggressor row detection signal RHR_TRIG. In some embodiments, the RHR_TRIG signal may be provided to a refresh control circuit, such as refresh control circuit 116 and/or 316. In some embodiments, when RHR_TRIG is activated, the access count XCount may be set to an initial value (e.g., '0') by the counter 452.

When a precharge command is received and/or the activation signal ACT is deactivated, the timer 454 may be disabled and the counter 452 may provide the updated access count value XCount to be written back to the count value memory cells 426.

The count control circuit 428 shown in FIG. 4 is provided merely as an example and the count control circuit 428 may have other configurations without exceeding the scope of the present disclosure. For example, in some embodiments, the count value XCount may not be read from the count value memory cells 426 responsive to the ACT command. Rather, in some embodiments, the counter 452 may be incremented when the timer 454 is enabled, and when the timer 454 is disabled, the access count XCount may be read from the count value memory cells 426. The access count value XCount may be combined (e.g., summed) with the number stored in the counter 452 and the updated access count XCount may be written back to the count value memory cells 426. The original and/or updated XCount value may be provided to the comparator 456.

Figure 5:
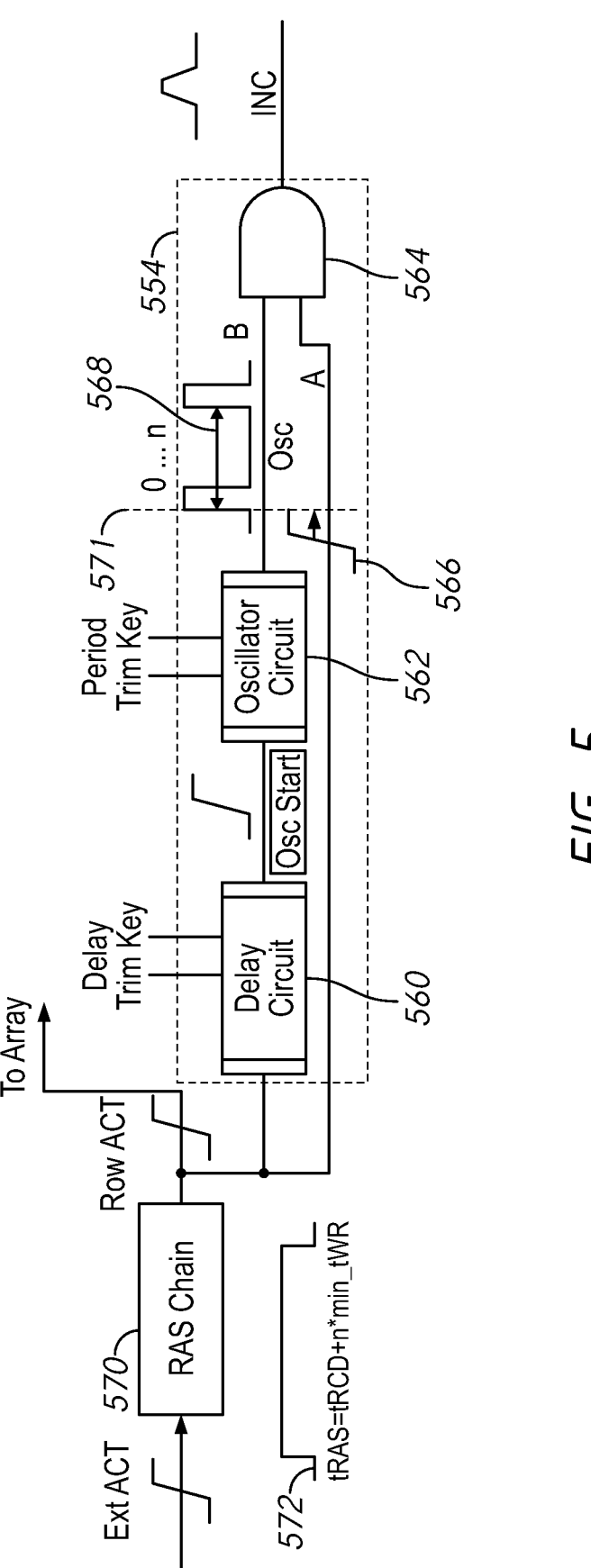
FIG. 5 is a block diagram of a timer circuit according to an embodiment of the present disclosure.

FIG. 5 is a block diagram of a timer circuit according to an embodiment of the present disclosure. The timer circuit 554 may be used to implement timer 454 in some embodiments. The timer circuit 554 may include a delay circuit 560, an oscillator circuit 562, and a logic circuit 564 (an AND circuit in the example shown). For context, a RAS timing chain 570 is also illustrated. The RAS timing chain 570 represents the circuits and operations associated with accessing a word line. As indicated by plot 572, the time a word line (row) is active is the row active time (tRAS), which may be equal to the row address strobe RAS to column address strobe CAS delay (tRCD) plus a non-zero multiple (n) of the minimum write recovery time (min_tWR).

A memory device (e.g., device 100) may receive an external activation command or signal Ext ACT, which may be provided to the RAS timing chain 570. The timer circuit 554 may receive an internal row activation signal Row ACT from the RAS timing chain 570. The Row ACT signal may also be provided to a memory array (e.g., memory array 118). The oscillator circuit 562 may be enabled by the active Row ACT signal, which may cause the timer circuit 554 to provide a periodic increment signal INC. The periodic increment signal INC may cause a counter circuit (e.g., counter 452) to adjust a count value (e.g., access count XCount). When the Row ACT signal is inactive, the timer circuit 554 no longer provide a periodic signal. This may cause the counter circuit to cease adjusting the count value.

The Row ACT signal may be provided to the delay circuit 560 and the logic circuit 564. The delay circuit 560 may delay the Row ACT to delay enablement of the oscillator circuit 562. The delay circuit 560 may delay enablement of the oscillator circuit 562 to ensure that the active Row ACT signal 566 is provided to the logic circuit 564 at a time such that there is no conflict between when the oscillation signal Osc goes high and the Row ACT signal goes low responsive to a precharge command as indicated by line 571. In some embodiments, the length of the delay provided by delay circuit 560 may be equal to the tRCD plus the delay between when the oscillator circuit 562 is enabled and when the oscillator circuit 562 provides a first pulse. Optionally, the delay may further include some margin. In some embodiments, the delay required may be based on test flows performed on the timer circuit 554. In some embodiments, the delay of the delay circuit 560 may be programmed by a trim key. The trim key may be provided from a fuse array (e.g., fuse array 458) and/or a mode register (e.g., mode register 130).

The oscillator circuit 562 may provide the periodic oscillating signal Osc when enabled by an active start signal Osc start provided from the delay circuit 560. The period 568 of the Osc signal may be programmed into the oscillator circuit by a trim key. The trim key may be provided from the fuse array and/or the mode register. The period may be based, at least in part, on an expected length of time a word line is active during a typical access operation in some embodiments.

The oscillating signal Osc and the Row ACT signal are provided to the logic circuit 564. When the Row ACT signal is active, the logic circuit 564 passes the Osc signal as the increment signal INC which may cause a counter circuit to increment an access count value. When the Row ACT signal is inactive, the logic circuit 564 may mask the Osc signal, and the INC signal may not provide pulses to the counter circuit.

Figure 6:
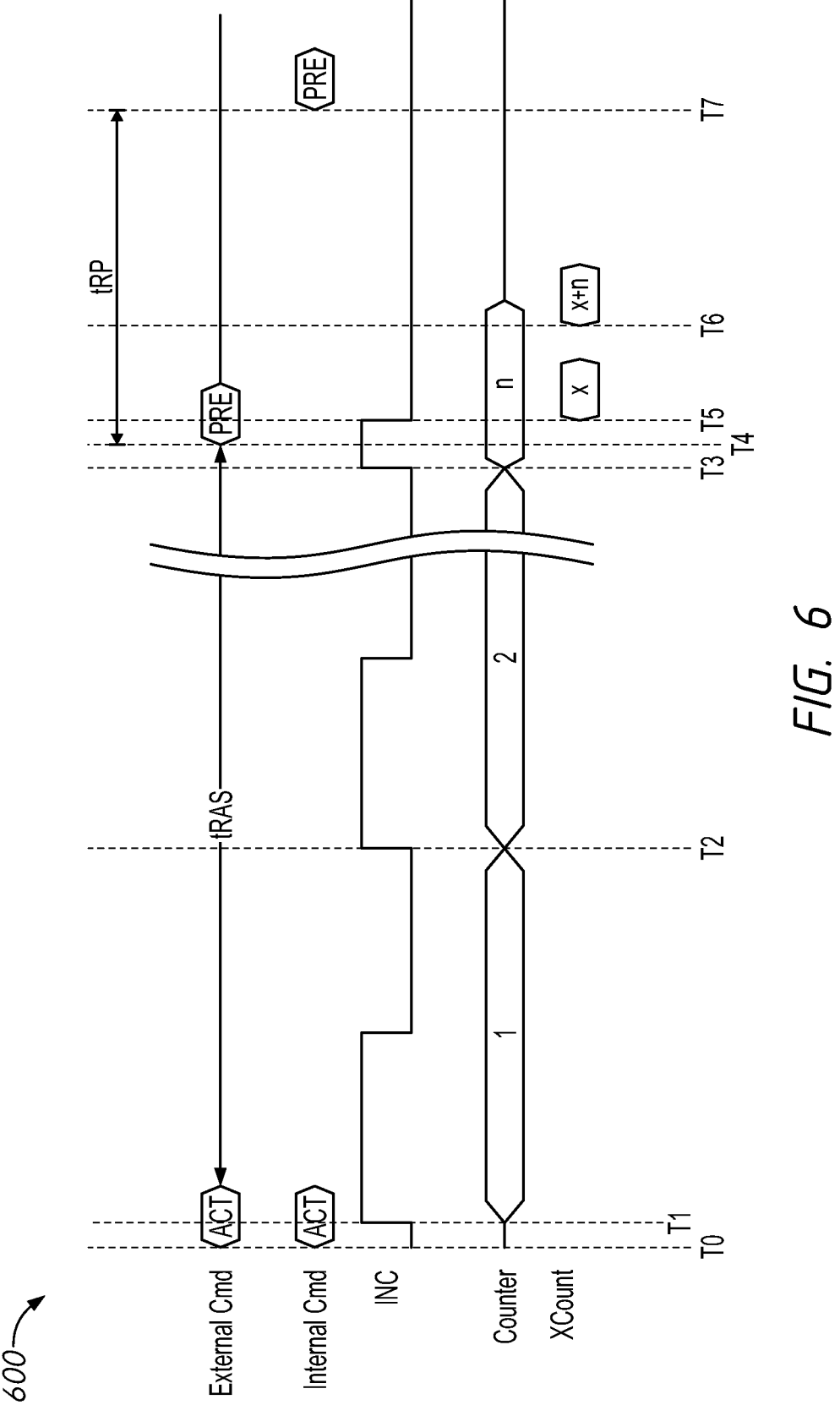
FIG. 6 is a timing diagram according to an embodiment of the present disclosure.

FIG. 6 is a timing diagram illustrating states of certain signals according to at least one embodiment of the present disclosure. The signals shown in timing diagram 600 may be signals generated and/or received by a memory device, such as device 100, or components of a memory device.

The top line of timing diagram 600 indicates the timing external commands received by the memory device. The external commands may be provided by a controller, such as memory controller 101. The external commands may be received at C/A terminals coupled to a command address input circuit, such as command address input circuit 102. The second line of timing diagram 600 indicates the timing of internal commands of the memory device. In some embodiments, the internal commands may be issued by a command decoder, such as command decoder 106, responsive to receiving the external commands.

The third line of timing diagram 600 illustrates a state of an increment signal INC, which may be a periodic signal provided by a timer, such as timer 454 and/or 554. The fourth line of timing diagram 600 illustrates a state of a count value stored in a counter, such as counter 452. The last line of timing diagram 600 illustrates the access count value XCount read from or written to count value memory cells, such as count value memory cells 126, 226, 326, and/or 426.

At or around time T0, the memory device may receive an external activation command ACT and the memory device may provide an internal activation command ACT. In some embodiments, the external and/or internal activation command may activate an ACT signal provided to the timer. Responsive to the active ACT signal, the timer may be enabled. At or around time T1, the timer may provide a periodic increment signal INC. Responsive, at least in part, to an edge (a rising edge in the example shown in FIG. 6) of the INC signal, the counter may increment a count value at or around T1. The counter may increment the count value responsive to each rising edge of the INC signal as shown at or around times T2, and T3.

At or around time T4, an external precharge command may be received by the memory device. Responsive, at least in part, to the external precharge command, the ACT signal provided to the timer may be deactivated, which may disable the timer. In some embodiments, responsive, at least in part, to the external precharge command, the access count XCount stored in the count value memory cells may be read at or around time T5. The access count value XCount may be combined (e.g., summed) with the value n of the counter (where n is a whole number equal to or greater than 1) and the updated (X+n) access count XCount is written back to the count value memory cells at or around time T6.

Alternatively, in other embodiments, the access count value XCount may be read from the count value memory cells at or around time T0 and provided to the counter. The counter may be incremented as previously described, but may increment from X+1, and the final value in the counter around or after T3 may be X+n rather than n as shown in FIG. 6. In this embodiment, X+n may be written back to the count value memory cells at or around T5 or at or around T6.

At or around time T7, an internal precharge command may be provide within the memory device. In some embodiments, the word line may be closed (e.g., deactivated) responsive to the internal precharge command. The time between the external precharge command and the internal precharge command may be tRP. In some embodiments, the specification of the memory device, which may be defined by a standard, may indicate tRP is equal to or greater than tWR. In some applications, this may reduce or eliminate the risk that the word line will be deactivated before the updated count value XCount is written to the count value memory cells.

Figure 7:
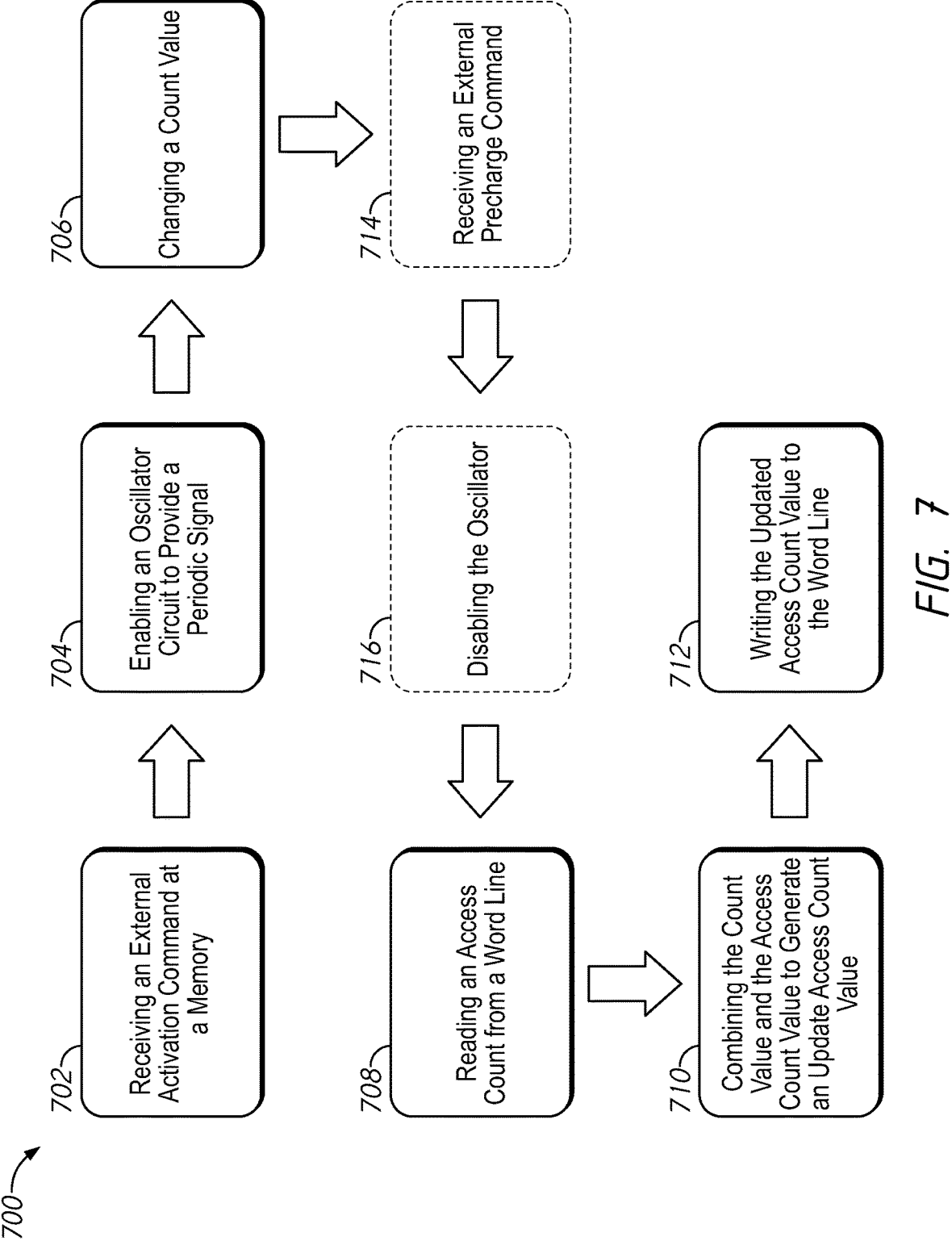
FIG. 7 is a flow chart of a method according to an embodiment of the present disclosure.

FIG. 7 is a flow chart of a method according to at least one embodiment of the present disclosure. The method 700 may be performed in whole or in part by a memory device, such as memory device 100 in some embodiments. In some embodiments, method 700 may be performed in whole or in part by a count control circuit, such as count control circuit 128, 328, and/or 428.

At block 702, "receiving an external activation command at a memory" may be performed.

Responsive, at least in part, to the external activation command, at block 704 "enabling an oscillator circuit to provide a periodic signal" may be performed. The oscillator circuit may be oscillator circuit 562 in some embodiments.

Responsive to the periodic signal, at block 706 "changing a count value" may be performed. In some embodiments, a counter circuit, such as counter 452 may change the count value. In some embodiments, the count value may be stored in a register of the counter.

At block 708, "reading an access count from a word line" may be performed. In some embodiments, the access count represents a value indicating a number of times the word line has been accessed and a length of time the word line is active. In some embodiments, the access count may be read from count value memory cells, such as count value memory cells 126, 226, 326, and/or 426. In some embodiments, reading the access count value from the word line is performed responsive, at least in part, to the external activation command At block 710, "combining the count value and the access count value to generate an updated access count value" may be performed.

At block 712, "writing the updated access count value to the word line" may be performed. In some embodiments, combining and writing are performed each time the count value is changed.

In some embodiments, at block 714, "receiving an external precharge command" may be performed. Responsive, at least in part, to the external precharge command, at block 716, "disabling the oscillator" may be performed.

In some embodiments, reading the access count from the word line is performed responsive to the external precharge command. However, as noted above, in some embodiments, this may be performed responsive to an activation command. Thus, block 708 may precede block 714 in some embodiments. In some embodiments, writing the updated access count value to the word line is performed responsive to the external precharge command. However, in embodiments where the access count value is repeatedly written to the word line, at least one time block 712 and/or block 710 are performed may precede block 714 in some embodiments.

Optionally, method 700 may further include delaying the enabling of the oscillator and/or setting a period of the periodic signal with a trim key The apparatuses and methods disclosed herein may provide a deterministic technique for detecting various memory attacks, such as row hammer and clobber attacks. At least some of the apparatuses and methods disclosed herein may allow for tracking a number of activations and/or time of activation of word lines. Tracking values may be stored in count value memory cells associated with individual word lines.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a word line comprising a plurality of count value memory cells configured to store an access count, wherein the access count represents a value indicating a number of times the word line has been accessed and a length of time the word line is active;
   a timer circuit configured to provide a periodic signal responsive, at least in part, to an activation signal;
   a counter circuit configured to change the access count responsive, at least in part, to the periodic signal and provide an updated access count value to the plurality of count value memory cells;
   an oscillator configured to provide the periodic signal responsive to an active enable signal; and
   a delay circuit configured to receive the activation signal and provide the active enable signal to the oscillator.

2. The apparatus of claim 1, wherein a period of the periodic signal is programmable by providing a period trim key to the oscillator and a delay of the delay circuit is programmable by providing a delay trim key to the delay circuit.

3. The apparatus of claim 2, wherein the period trim key, the delay trim key, or both are provided from a fuse array or a mode register.

4. The apparatus of claim 1, further comprising a logic circuit configured to receive the periodic signal from the oscillator and the activation signal, wherein the logic circuit is configured to provide the periodic signal to the counter circuit when the activation signal is active.

5. The apparatus of claim 1, further comprising a comparator circuit configured to compare the access count value, the updated access count value, or both to a threshold value.

6. The apparatus of claim 5, wherein the comparator circuit is configured to activate a trigger signal based on a comparison of the access count value, the updated access count value, or both to the threshold value.

7. A method comprising:
   receiving an external activation command at a memory;
   responsive, at least in part, to the external activation command, enabling an oscillator circuit to provide a periodic signal;
   changing a count value responsive to the periodic signal;
   reading an access count from a word line, wherein the access count represents a value indicating a number of times the word line has been accessed and a length of time the word line is active;
   combining the count value and the access count to generate an updated access count;
   writing the updated access count to the word line;

receiving an external precharge command; and disabling the oscillator responsive, at least in part, to the external precharge command.

8. The method of claim 7, wherein the reading the access count from the word line is performed responsive to the external precharge command.

9. The method of claim 7, wherein the writing the updated access count to the word line is performed responsive to the external precharge command.

10. The method of claim 7, wherein the reading the access count from the word line is performed responsive, at least in part, to the external activation command.

11. The method of claim 7, wherein the combining and the writing are performed each time the count value is changed.

12. A method comprising:

receiving an external activation command at a memory;

responsive, at least in part, to the external activation command, enabling an oscillator circuit to provide a periodic signal;

changing a count value responsive to the periodic signal;

reading an access count from a word line, wherein the access count represents a value indicating a number of times the word line has been accessed and a length of time the word line is active;

combining the count value and the access count to generate an updated access count;

writing the updated access count to the word line; and delaying the enabling of the oscillator.

13. A method comprising:

receiving an external activation command at a memory;

responsive, at least in part, to the external activation command, enabling an oscillator circuit to provide a periodic signal;

changing a count value responsive to the periodic signal;

reading an access count from a word line, wherein the access count represents a value indicating a number of times the word line has been accessed and a length of time the word line is active;

combining the count value and the access count to generate an updated access count;

writing the updated access count to the word line; and setting a period of the periodic signal with a trim key.

14. A memory device comprising:

a memory array comprising a plurality of word lines, each comprising at least one count value memory cell configured to store an access count that represents a value indicating a number of times a respective word line of the plurality of word lines has been accessed and a length of time the respective word line is active;

a refresh control circuit configured to selectively cause ones of the plurality of word lines to be refreshed; and a count control circuit configured to read the access count, update the access count, and write an updated access count to the respective word line of the plurality of word lines, wherein the count control circuit comprises:

a timer configured to be enabled by an activation command and disabled by a precharge command; and a counter configured to update the access count based, at least in part, on a periodic signal provided by the timer when enabled.

15. The memory device of claim 14, wherein the count control circuit is further configured to compare the access count, the updated access count, or both to a threshold value and provide a signal to the refresh control signal based on a comparison of the access count, the updated access count, or both to the threshold value.

16. The memory device of claim 14, wherein a row precharge time ((RP) of the memory device is equal to or greater than a write recovery time (tWR) of the memory device that allows the updated access count to be written to the respective word line.

17. The memory device of claim 14, wherein a period of the periodic signal is programmable.

18. The memory device of claim 14, wherein the periodic signal may be delayed by an amount indicated by a trim key.

* * * * *